United States Patent
Fujimoto et al.

(10) Patent No.: US 11,651,936 B2
(45) Date of Patent: May 16, 2023

(54) CHARGED PARTICLE BEAM APPARATUS

(71) Applicant: JEOL Ltd., Tokyo (JP)

(72) Inventors: Naoki Fujimoto, Tokyo (JP); Izuru Chiyo, Tokyo (JP)

(73) Assignee: JEOL Ltd., Tokyo (JP)

(*) Notice: Subject to any disclaimer, the term of this patent is extended or adjusted under 35 U.S.C. 154(b) by 33 days.

(21) Appl. No.: 17/551,384

(22) Filed: Dec. 15, 2021

(65) Prior Publication Data

US 2022/0189731 A1 Jun. 16, 2022

(30) Foreign Application Priority Data

Dec. 16, 2020 (JP) .............................. JP2020-208387

(51) Int. Cl.
*H01J 37/244* (2006.01)
*H01J 37/20* (2006.01)

(52) U.S. Cl.
CPC ............ *H01J 37/244* (2013.01); *H01J 37/20* (2013.01); *H01J 2237/2001* (2013.01); *H01J 2237/2007* (2013.01)

(58) Field of Classification Search
CPC .. H01J 37/244; H01J 37/20; H01J 2237/2001; H01J 2237/2007; H01J 2237/184; H01J 37/185; H01J 2237/204
See application file for complete search history.

(56) References Cited

U.S. PATENT DOCUMENTS

| | | | | |
|---|---|---|---|---|
| 5,912,096 A * | 6/1999 | Hada | ................... | H01J 37/3174 |
| | | | | 430/30 |
| 6,231,776 B1 * | 5/2001 | Flamm | ..................... | H05H 1/46 |
| | | | | 315/111.21 |
| 6,765,647 B1 * | 7/2004 | Nishi | .................... | G03F 9/7026 |
| | | | | 355/71 |

(Continued)

FOREIGN PATENT DOCUMENTS

| JP | H10303092 A | 11/1998 |
|---|---|---|
| JP | 2014139980 A | 7/2014 |
| JP | 201588237 A | 5/2015 |

OTHER PUBLICATIONS

Office Action issued in JP2020208387 dated Dec. 13, 2022.

*Primary Examiner* — David A Vanore
(74) *Attorney, Agent, or Firm* — The Webb Law Firm (57) ABSTRACT

A charged particle beam apparatus includes: a specimen chamber; a specimen holder that is disposed in the specimen chamber; a specimen exchange chamber that is connected to the specimen chamber; a transporting mechanism that transports a specimen between the specimen chamber and the specimen exchange chamber; a first temperature sensor that measures a temperature of the specimen holder; a second temperature sensor that measures a temperature of the transporting mechanism; and a control unit. The control unit: calculates a temperature difference between the specimen holder and the transporting mechanism based on the temperature of the specimen holder and the temperature of the transporting mechanism when the control unit has received (Continued)

an instruction to transport a specimen; determining whether the temperature difference is a threshold or more; and stopping transportation of a specimen when the control unit has determined that the temperature difference is the threshold or more.

5 Claims, 6 Drawing Sheets

(56) References Cited

U.S. PATENT DOCUMENTS

| | | | | |
|---|---|---|---|---|
| 2005/0140946 | A1* | 6/2005 | Tsuji | G03F 7/709 |
| | | | | 355/53 |
| 2005/0140959 | A1* | 6/2005 | Tsuji | G03F 7/70891 |
| | | | | 355/75 |
| 2012/0112068 | A1* | 5/2012 | Maeda | H01J 37/265 |
| | | | | 250/310 |
| 2015/0137000 | A1* | 5/2015 | Naruse | H01J 37/20 |
| | | | | 250/441.11 |
| 2015/0340198 | A1 | 11/2015 | Nakagawa et al. | |
| 2016/0005568 | A1* | 1/2016 | Mizuochi | H01J 37/20 |
| | | | | 250/442.11 |
| 2020/0027763 | A1* | 1/2020 | Gosen | H01L 21/67167 |
| 2020/0124531 | A1* | 4/2020 | Noda | G01N 33/54373 |
| 2020/0144019 | A1* | 5/2020 | Van Heumen | H01J 37/28 |
| 2020/0150061 | A1* | 5/2020 | Kriele | H01M 10/647 |
| 2021/0159111 | A1* | 5/2021 | Prengle | H01L 21/67115 |
| 2022/0189731 | A1* | 6/2022 | Fujimoto | H01J 37/244 |

* cited by examiner

CHARGED PARTICLE BEAM APPARATUS

CROSS-REFERENCE TO RELATED APPLICATION

This application claims priority to Japanese Patent Application No. 2020-208387 filed Dec. 16, 2020, the disclosure of which is hereby incorporated by reference in its entirety.

BACKGROUND OF THE INVENTION

Field of the Invention

The present invention relates to a charged particle beam apparatus.

Description of Related Art

In a charged particle beam apparatus, such as a transmission electron microscope, a specimen is loaded into a specimen chamber and observed and analyzed. In such charged particle beam apparatuses, a charged particle beam apparatus, that includes a transporting mechanism to transport a specimen between the specimen chamber and the specimen exchange chamber, is known.

For example, JP-A-2015-88237 discloses a charged particle beam apparatus equipped with a transporting mechanism that transports a cartridge, in which a specimen is fixed, between a specimen exchange chamber and a specimen chamber. The transporting mechanism transfers the cartridge to a specimen holder disposed in the specimen chamber.

If there is a temperature difference between the transporting mechanism and the specimen holder when the transporting mechanism transfers a specimen to the specimen holder, a position of the transporting mechanism and a position of the specimen holder are misaligned when a specimen is transferred. For example, when the temperature of the transporting mechanism is lower than the temperature of the specimen holder, a member constituting the transporting mechanism contracts more than a member constituting the specimen holder, and this causes the misalignment.

If the misalignment occurs like this, the specimen holder and the transporting mechanism may rub against each other, or the specimen holder and the cartridge may rub against each other. Because of this, metal particles may scatter in the specimen chamber. Further, the transporting mechanism and the specimen holder may deteriorate. Furthermore, the cartridge may not be transported normally, and the cartridge may drop into a lens barrel, or damage the transporting mechanism or the specimen holder.

SUMMARY OF THE INVENTION

According to an aspect of the invention, there is provided a charged particle beam apparatus including:
a specimen chamber;
a specimen holder that is disposed in the specimen chamber;
a specimen exchange chamber that is connected to the specimen chamber;
a transporting mechanism that transports a specimen between the specimen chamber and the specimen exchange chamber;
a first temperature sensor that measures a temperature of the specimen holder;
a second temperature sensor that measures a temperature of the transporting mechanism; and
a control unit that controls the transporting mechanism, the control unit performing processing of:
calculating a temperature difference between the specimen holder and the transporting mechanism based on information on the temperature of the specimen holder measured by the first temperature sensor and information on the temperature of the transporting mechanism measured by the second temperature sensor when the control unit has received an instruction to transport a specimen;
determining whether or not the temperature difference is a threshold or more; and
stopping transportation of a specimen when the control unit has determined that the temperature difference is the threshold or more.

DESCRIPTION OF THE INVENTION

A charged particle beam apparatus according to an embodiment of the invention, includes:
a specimen chamber;
a specimen holder that is disposed in the specimen chamber;
a specimen exchange chamber that is connected to the specimen chamber;
a transporting mechanism that transports a specimen between the specimen chamber and the specimen exchange chamber;
a first temperature sensor that measures a temperature of the specimen holder;
a second temperature sensor that measures a temperature of the transporting mechanism; and
a control unit that controls the transporting mechanism, the control unit performing processing of:
calculating a temperature difference between the specimen holder and the transporting mechanism based on information on the temperature of the specimen holder measured by the first temperature sensor and information on the temperature of the transporting mechanism measured by the second temperature sensor when the control unit has received an instruction to transport a specimen;

determining whether or not the temperature difference is a threshold or more; and stopping transportation of a specimen when the control unit has determined that the temperature difference is the threshold or more.

In this charged particle beam apparatus, transportation of a specimen is stopped if there is a temperature difference between the specimen holder and the transporting mechanism, hence it can be prevented that the specimen holder and the transporting mechanism rub against each other or the specimen holder and the specimen rub against each other by the misalignment of the specimen holder and the transporting mechanism when a specimen is transferred.

Preferred embodiments of the invention will be described in detail below with reference to the drawings. It is noted that the following embodiments do not unduly limit the scope of the invention as stated in the claims. Further, all of the components described in the following embodiments are not necessarily essential requirements of the invention.

In the following, a transmission electron microscope, that performs observation and analysis of a specimen by emitting an electron beam onto the specimen, will be described as an example of the charged particle beam apparatus according to the invention, but the charged particle beam apparatus according to the invention may be an apparatus that performs observation and analysis of a specimen by emitting a charged particle beam other than an electron beam, such as an ion beam.

1. Electron Microscope

Figure 1:
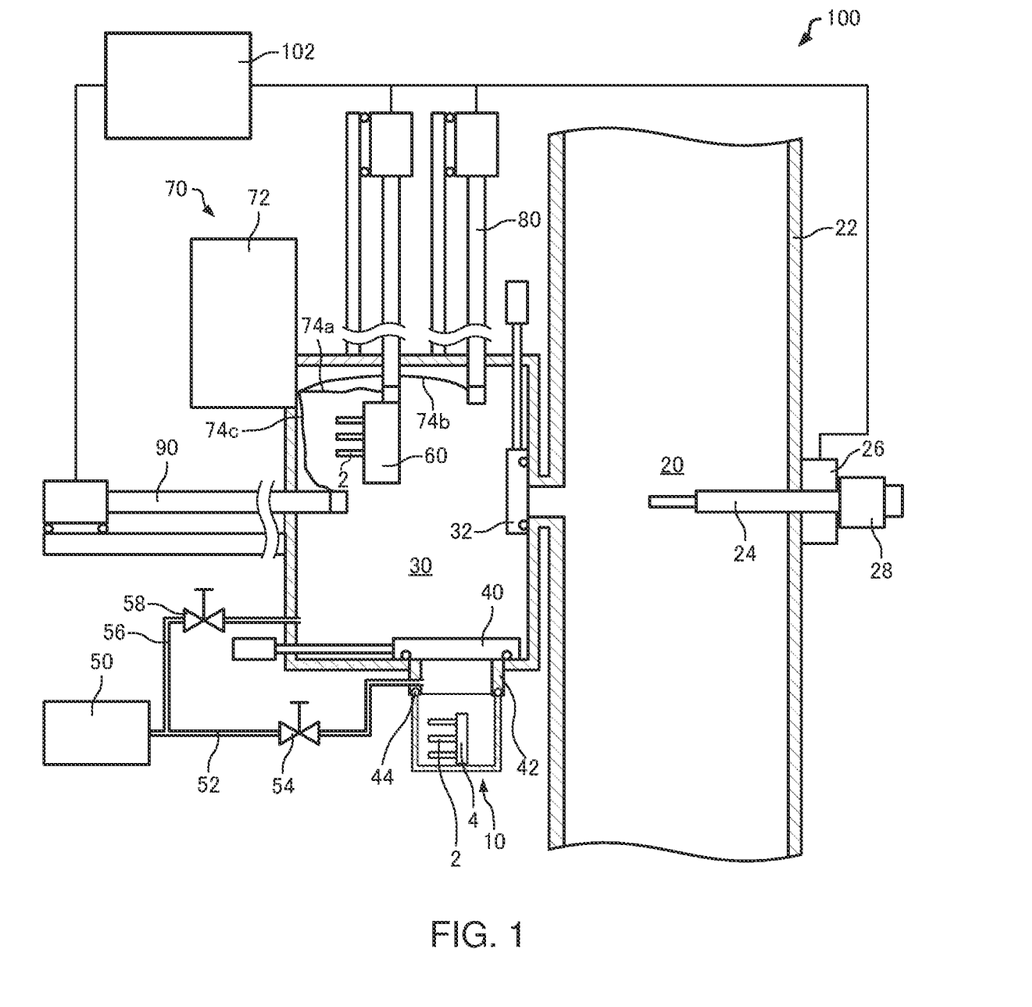
FIG. 1 is a diagram illustrating a configuration of an electron microscope according to an embodiment of the invention.

First an electron microscope, which is an embodiment of the invention, will be described with reference to the drawings. FIG. 1 is a diagram illustrating a configuration of an electron microscope 100 according to an embodiment of the invention.

The electron microscope 100 is a transmission electron microscope (cryo-electron microscope) that can load and observe a specimen in a frozen state. With the electron microscope 100, a specimen can be observed at a liquid nitrogen temperature, for example.

As illustrated in FIG. 1, the electron microscope 100 includes a specimen container 10, a specimen chamber 20, a specimen holder 24, a specimen stage 26, a first cooling mechanism 28, a specimen exchange chamber 30, a gate valve 40, an evacuation device 50, a specimen storage 60, a second cooling mechanism 70, a first transporting mechanism 80, a second transporting mechanism 90, and a control unit 102.

The specimen container 10 is a container to transport a cooled specimen. The specimen container 10 can contain a magazine 4 in which a plurality of cartridges 2 is installed. In each cartridge 2, a specimen is fixed.

Specimens may be contained directly in the specimen container 10 without using the cartridge 2 or magazine 4.

The specimen container 10 can be connected to the specimen exchange chamber 30. As illustrated in FIG. 1, the specimen container 10 is connected to the specimen exchange chamber 30 in the state where the gate valve 40 is closed. The specimen container 10 is connected to the specimen exchange chamber 30 via a connecting member 42.

The specimen container 10 is evacuated by the evacuation device 50 in the state where the gate valve 40 is closed. Therefore an increase of pressure (deterioration of degree of vacuum) in the specimen exchange chamber 30 can be prevented, even if the gate valve 40 is opened. Therefore in the electron microscope 100, the magazine 4 can be loaded from the specimen container 10 to the specimen exchange chamber 30 while maintaining the specimen exchange chamber 30 in the vacuum state.

The specimen chamber 20 includes a space inside a lens barrel 22. In the lens barrel 22, an electron source, an irradiation optical system to irradiate a specimen with an electron beam emitted from the electron source, and an imaging system to form a transmission electron microscope image by the electron beam transmitted through a specimen are arranged, (these composing elements are not illustrated in FIG. 1). The electron microscope 100 also includes a detector to detect an image formed by the imaging system, a detector to detect an X-ray emitted from a specimen, and the like (these composing elements are not illustrated in FIG. 1).

The specimen holder 24 is disposed in the specimen chamber 20. The specimen holder 24 is installed in the specimen stage 26. The specimen held by the specimen holder 24 is positioned by the specimen stage 26. In the specimen chamber 20, a specimen is irradiated with the electron beam. The specimen chamber 20 is evacuated by an evacuation device (not illustrated). Thereby the specimen chamber 20 is maintained in a vacuum state.

The specimen holder 24 is a holder that can cool a specimen. The specimen holder 24 includes the first cooling mechanism 28 to cool a specimen. For example, the first cooling mechanism 28 includes a tank to store liquid nitrogen, which is a refrigerant. Thereby a specimen can be cooled down to the liquid nitrogen temperature in the specimen holder 24.

The specimen exchange chamber 30 is connected to the specimen chamber 20. A gate valve 32 is disposed between the specimen exchange chamber 30 and the specimen chamber 20. The gate valve 32 is a valve that is used as a vacuum partition between the specimen exchange chamber 30 and the specimen chamber 20.

The specimen exchange chamber 30 is evacuated by the evacuation device 50. Thereby the specimen exchange chamber 30 is maintained in a vacuum state.

The specimen container 10 is connected to the specimen exchange chamber 30. In the case of the example in FIG. 1, the specimen container 10 is connected to the specimen exchange chamber 30 via a connecting member 42. The connecting member 42 is connected to the specimen exchange chamber 30. An O-ring 44 is attached to the end face of the connecting member 42, so that the space between the specimen container 10 and the connecting member 42 is sealed by the O-ring 44.

The evacuation device 50 evacuates the specimen container 10 via an exhaust pipe 52. A solenoid valve 54 is disposed in the exhaust pipe 52. The evacuation device 50 evacuates the specimen container 10 in a state where the specimen container 10 is connected to the specimen exchange chamber 30 and the gate valve 40 is closed, whereby the specimen container 10 can be in a vacuum state.

The evacuation device 50 also evacuates the specimen exchange chamber 30. The evacuation device 50 evacuates the specimen exchange chamber 30 via an exhaust pipe 56. A solenoid valve 58 is disposed in the exhaust pipe 56.

The specimen storage 60 is disposed in the specimen exchange chamber 30. The specimen storage 60 is a place to store specimens. The specimen storage 60 can hold a plurality of specimens. In the case of the example of FIG. 1, the specimen storage 60 holds a plurality of cartridges 2 in which specimens are fixed respectively.

The specimen storage 60 is cooled by the second cooling mechanism 70. Therefore a specimen can be stored in the cooled state. The specimen storage 60 is formed by a material having high thermal conductivity, for example.

The second cooling mechanism 70 cools the specimen storage 60. The second cooling mechanism 70 includes a tank 72 that stores the refrigerant (e.g. liquid nitrogen tank that stores liquid nitrogen), and a thermally conductive member 74a that thermally connects the tank 72 and the specimen storage 60, for example. The specimen storage 60 can be cooled, since the tank 72 and the specimen storage 60 are thermally connected by the thermally conductive member 74a.

The second cooling mechanism 70 also cools the first transporting mechanism 80 and the second transporting mechanism 90. The second cooling mechanism 70 includes a thermally conductive member 74b that thermally connects the tank 72 and the first transporting mechanism 80, and a thermally conductive member 74c that thermally connects the tank 72 and the second transporting mechanism 90. The thermally conductive members 74a, 74b and 74c are copper wires, for example.

The tank that stores the refrigerant of the first cooling mechanism 28 and the tank 72 may be integrated as a common tank, although this is not illustrated. In other words, the specimen holder 24, the specimen storage 60, the first transporting mechanism 80 and the second transporting mechanism 90 may be cooled using this one tank.

The first transporting mechanism 80 transports a specimen between the specimen container 10 and the specimen exchange chamber 30. Here the first transporting mechanism 80 transports a specimen by transporting the magazine 4. The first transporting mechanism 80 holds the magazine 4 in the specimen container 10, and transports the held magazine 4 from the specimen container 10 to the specimen exchange chamber 30. The first transporting mechanism 80 can also transport the magazine 4 from the specimen exchange chamber 30 into the specimen container 10.

The first transporting mechanism 80 is cooled by the second cooling mechanism 70. Therefore it can be prevented that the temperature of the magazine 4 rises while the magazine 4 is being transported by the first transporting mechanism 80.

The second transporting mechanism 90 transports a specimen between the specimen exchange chamber 30 and the specimen chamber 20. Here the second transporting mechanism 90 transports a specimen by transporting the cartridge 2.

Specifically, in the specimen exchange chamber 30, the second transporting mechanism 90 removes the cartridge 2 from the magazine 4 held by the first transporting mechanism 80, and transfers the cartridge 2 to the specimen holder 24 disposed in the specimen chamber 20. The second transporting mechanism 90 also removes the cartridge 2 from the specimen holder 24, and installs the cartridge 2 in the magazine 4 held by the first transporting mechanism 80 in the specimen exchange chamber 30.

Further, in the specimen exchange chamber 30, the second transporting mechanism 90 removes the cartridge 2 from the specimen storage 60 and transfers the cartridge 2 to the specimen holder 24 disposed in the specimen chamber 20. Furthermore, the second transporting mechanism 90 removes the cartridge 2 from the specimen holder 24 disposed in the specimen chamber 20, and installs the cartridge 2 in the specimen storage 60.

Furthermore, in the specimen exchange chamber 30, the second transporting mechanism 90 transports a specimen between the magazine 4 held by the first transporting mechanism 80 and the specimen storage 60. Specifically, in the specimen exchange chamber 30, the second transporting mechanism 90 removes the cartridge 2 from the magazine 4 held by the first transporting mechanism 80, and installs the cartridge 2 in the specimen storage 60. The second transporting mechanism 90 also removes the cartridge 2 from the specimen storage 60, and installs the cartridge 2 in the magazine 4 held by the first transporting mechanism 80.

The second transporting mechanism 90 is cooled by the second cooling mechanism 70. Therefore it can be prevented that the temperature of the cartridge 2 rises while the cartridge 2 is being transported by the second transporting mechanism 90.

The control unit 102 controls each composing element constituting the electron microscope 100. For example, in the later mentioned transporting processing, the control unit 102 controls the specimen holder 24, the gate valve 32 and the second transporting mechanism 90.

2. Configuration of Second Transporting Device

Figure 2:
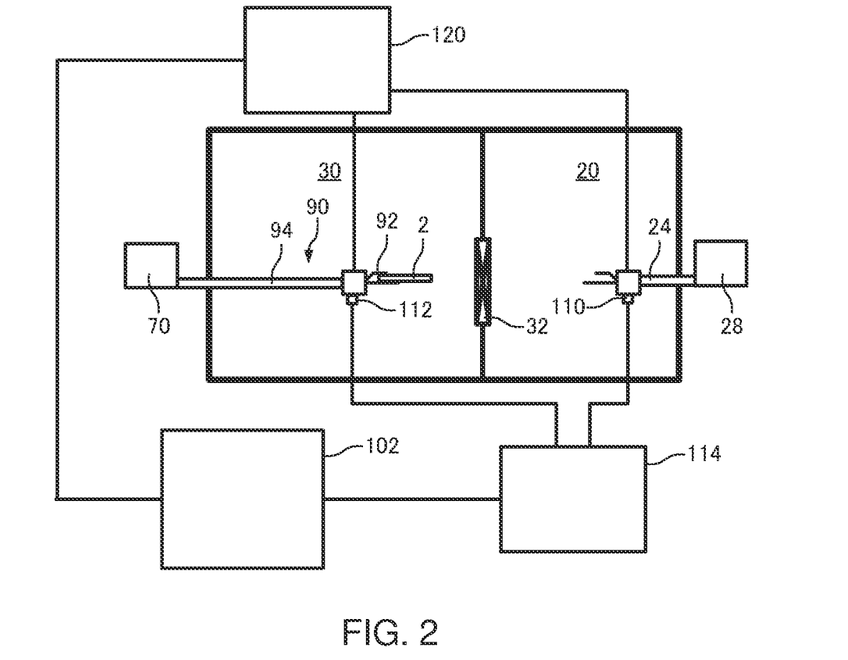
FIG. 2 is a diagram illustrating a configuration of a second transporting mechanism.

FIG. 2 is a diagram illustrating a configuration of the second transporting mechanism 90.

As illustrated in FIG. 2, the second transporting mechanism 90 includes a chuck device 92 and a transporting rod 94. The chuck device 92 is a device to hold the cartridge 2. The chuck device 92 is disposed at the front end of the transporting rod 94. The transporting rod 94 supports the chuck device 92. The second transporting mechanism 90 includes a moving device (not illustrated) that moves the transporting rod 94. The cartridge 2 that is held by the chuck device 92 can be moved by moving the transporting rod 94 using the moving device.

The chuck device 92 and the transporting rod 94 are cooled by the second cooling mechanism 70.

As illustrated in FIG. 2, the electron microscope 100 includes a first temperature sensor 110, a second temperature sensor 112, a temperature monitor 114, and a control circuit 120.

The first temperature sensor 110 measures the temperature of the specimen holder 24. The first temperature sensor 110 is a silicon diode, for example. The first temperature sensor 110 is installed in the specimen holder 24.

The second temperature sensor 112 measures the temperature of the second transporting mechanism 90. The second temperature sensor 112 is a silicon diode, for example. The second temperature sensor 112 measures the temperature of the chuck device 92, for example. The second temperature sensor 112 may measure the temperature of the transporting rod 94.

The temperature monitor 114 acquires information on the temperature of the specimen holder 24 and information on the temperature of the second transporting mechanism 90. The temperature monitor 114 acquires the information on the temperature of the specimen holder 24 based on the output signal of the first temperature sensor 110, and acquires the information on the temperature of the second transporting mechanism 90 based on an output signal of the second temperature sensor 112. The temperature monitor 114 has information on the current temperature of the specimen holder 24, and information on the current temperature of the second transporting mechanism 90.

The control circuit 120 is a circuit to operate the second transporting mechanism 90, the specimen holder 24 and the gate valve 32. The control circuit 120 receives a control signal from the control unit 102, and operates the second transporting mechanism 90, the specimen holder 24, and the gate valve 32 based on this control signal.

3. Configuration of Control Unit

Figure 3:
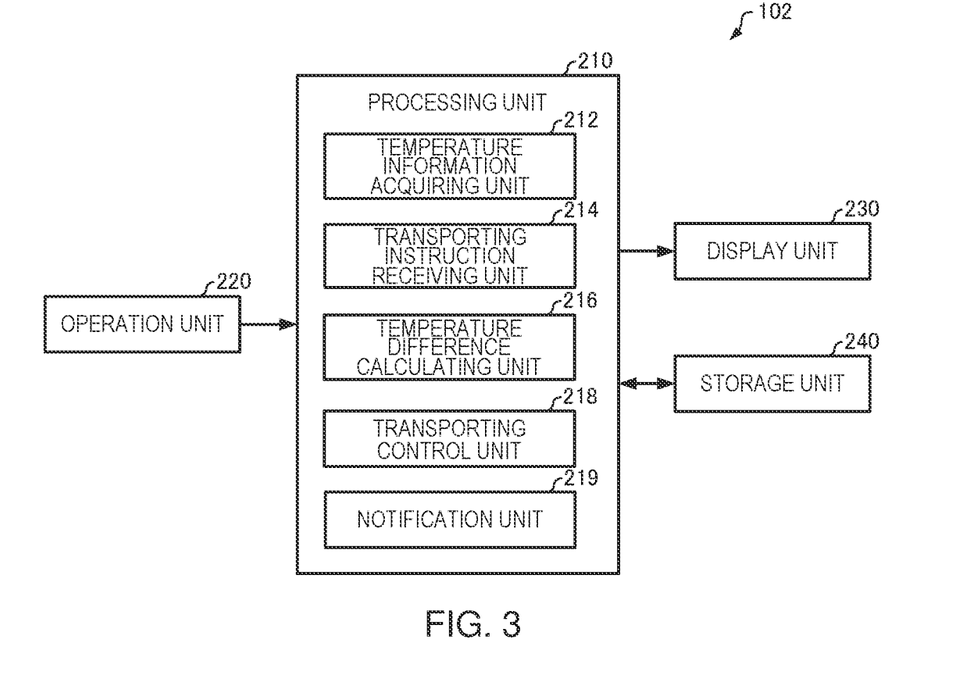
FIG. 3 is a diagram illustrating a configuration of a control unit.

FIG. 3 is a diagram illustrating a configuration of the control unit 102.

As illustrated in FIG. 3, the control unit 102 includes a processing unit 210, an operation unit 220, a display unit 230, and a storage unit 240.

The operation unit 220 is for the user to input operation information, and outputs the inputted operation information to the processing unit 210. The functions of the operation unit 220 can be implemented by such hardware as a keyboard, mouse, buttons, touch panel and touch pad.

The display unit 230 displays an image generated by the processing unit 210. The functions of the display unit 230 can be implemented by a liquid crystal display (LCD), a cathode ray tube (CRT), a touch panel which also functions as an operation unit 220, or the like. A graphical user interface (GUI) to control the electron microscope 100 is displayed on the display unit 230.

The storage unit 240 stores programs and various data to cause a computer to function as each composing element of the processing unit 210. The storage unit 240 also functions as a work area of the processing unit 210. The functions of the storage unit 240 can be implemented by a hard disk, a random access memory (RAM), or the like.

The processing unit 210 performs processing to transport the cartridge 2 and the magazine 4. The functions of the processing unit 210 can be implemented by hardware, such as various processors (e.g. central processing unit (CPU)). The processing unit 210 includes a temperature information acquiring unit 212, a transporting instruction receiving unit 214, a temperature difference calculating unit 216, a transporting control unit 218, and a notification unit 219.

The temperature information acquiring unit 212 acquires, from the temperature monitor 114, information on the temperature of the specimen holder 24 measured by the first temperature sensor 110, and information on the temperature of the second transporting mechanism 90 measured by the second temperature sensor 112.

The temperature information acquiring unit 212 requests the information on the temperature of the specimen holder 24 and the information on the temperature of the second transporting mechanism 90, to the temperature monitor 114 at predetermined time intervals. Responding to the request from the control unit 102, the temperature monitor 114 transfers the information on the temperature of the specimen holder 24 and the information on the temperature of the second transporting mechanism 90 to the temperature information acquiring unit 212.

The transporting instruction receiving unit 214 receives an instruction to transport a specimen (transporting instruction). For example, when the transporting button of the GUI displayed on the display unit 230 has been pressed, the transporting instruction receiving unit 214 determines that the user instructed to transport a specimen, and receives the transporting instruction.

When the transporting instruction has been received, the temperature difference calculating unit 216 calculates the temperature difference between the specimen holder 24 and the second transporting mechanism 90 based on the information on the temperature of the specimen holder 24 measured by the first temperature sensor 110 and the information on the temperature of the second transporting mechanism 90 measured by the second temperature sensor 112.

The transporting control unit 218 controls the first transporting mechanism 80 and the second transporting mechanism 90. The transporting control unit 218 also controls the specimen holder 24.

Further, the transporting control unit 218 determines whether or not the temperature difference between the specimen holder 24 and the second transporting mechanism 90 is a threshold or more.

The threshold has been stored in the storage unit 240 in advance. For example, the threshold is set to a value of a temperature difference or less, with which misalignment does not occur between the second transporting mechanism 90 and the specimen holder 24 when the cartridge 2 is transferred between the second transporting mechanism 90 and the specimen holder 24. For example, an optimum threshold can be determined by repeatedly transferring the cartridge 2 between the second transporting mechanism 90 and the specimen holder 24 at a different temperature difference setting. The threshold is set to 30° C., for example. The threshold can be changed when necessary.

When the transporting control unit 218 has determined that the temperature difference between the specimen holder 24 and the second transporting mechanism 90 is lower than the threshold, the transporting control unit 218 transfers the cartridge 2 from the specimen exchange chamber 30 to the specimen chamber 20. In a case where the cartridge 2 is in the specimen chamber 20, the transporting control unit 218 may transport the cartridge 2 from the specimen chamber 20 to the specimen exchange chamber 30, if the transporting control unit 218 has determined that the temperature difference between the specimen holder 24 and the second transporting mechanism 90 is smaller than the threshold.

When the transporting control unit 218 has determined that the temperature difference between the specimen holder 24 and the second transporting mechanism 90 is the threshold or more, the transporting control unit 218 stops the transporting of the cartridge 2.

When the transporting control unit 218 has determined that the temperature difference between the specimen holder 24 and the second transporting mechanism 90 is the threshold or more, the notification unit 219 notifies alarm information. The alarm information is a message indicating that the transporting is stopped since the temperature difference between the specimen holder 24 and the second transporting mechanism 90 is large, for example. The notification unit 219 causes the display unit 230 to display such a message. The notification by the notification unit 219 is not limited to the display of a message, but may be notification by sound using a buzzer, for example, or may be notification by light using a lamp, for example.

4. Operation

An operation of the electron microscope 100 will be described next. Here an operation when the second transporting mechanism 90 transports the cartridge 2 from the specimen exchange chamber 30 to the specimen chamber 20 will be described.

In the electron microscope 100, the cartridge 2 can be automatically transported from the specimen exchange chamber 30 to the specimen chamber 20. Also in the electron microscope 100, the control unit 102 performs the transporting processing to transport the cartridge 2 from the specimen exchange chamber 30 to the specimen chamber 20, whereby the cartridge 2 can be transported from the specimen exchange chamber 30 to the specimen chamber 20.

Figure 4:
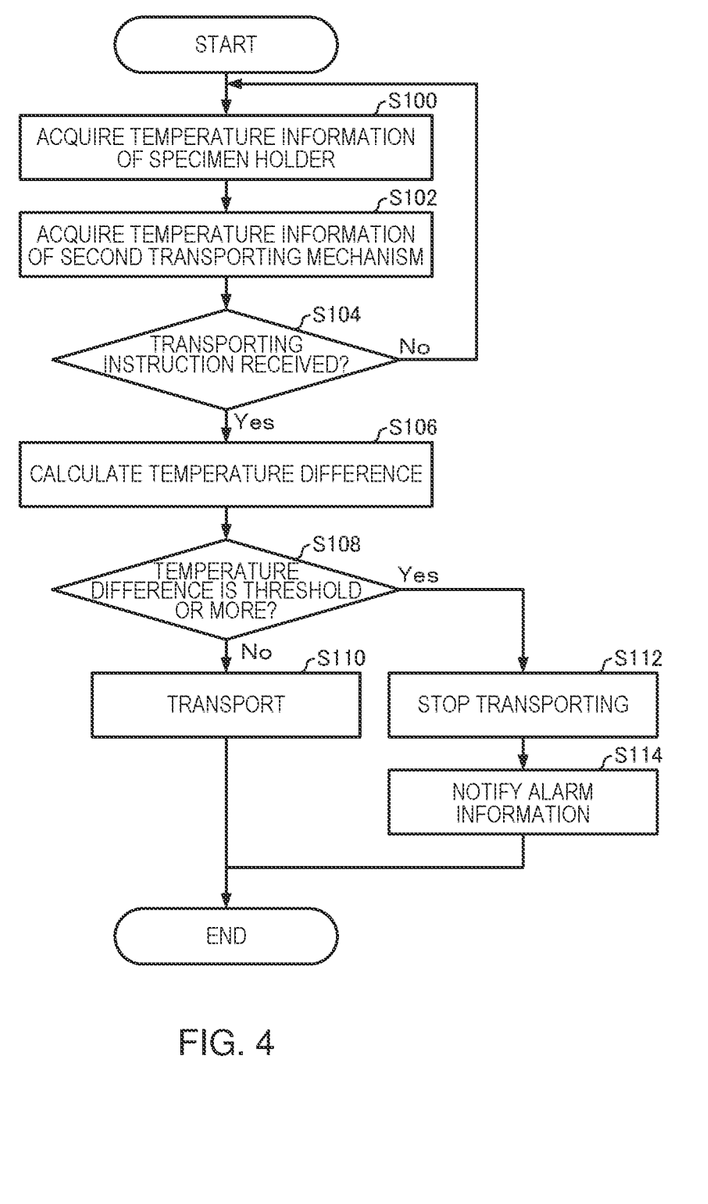
FIG. 4 is a flow chart illustrating an example of a transporting processing.

FIG. 4 is a flow chart illustrating an example of the transporting processing by the control unit 102.

The temperature information acquiring unit 212 acquires information on the temperature of the specimen holder 24, which was measured by the first temperature sensor 110, from the temperature monitor 114 (S100). Then the temperature information acquiring unit 212 acquires information on the temperature of the second transporting mechanism 90, which was measured by the second temperature sensor 112, from the temperature monitor 114 (S102).

The temperature information acquiring unit 212 may acquire information on the temperature of the specimen holder 24 after acquiring the information on the temperature of the second transporting mechanism 90. The temperature information acquiring unit 212 may simultaneously acquire both the information on the temperature of the specimen holder 24 and the information on the temperature of the second transporting mechanism 90.

The transporting instruction receiving unit 214 determines whether or not the user performed the transporting instruction (S104).

When the transporting instruction receiving unit 214 has determined that the transporting instruction was not performed (No in S104), the processing returns to S100, and the processing of acquiring the information on the temperature of the specimen holder 24 (S100) and the processing of acquiring the information on the temperature of the second transporting mechanism 90 (S102) are performed. The temperature information acquiring unit 212 repeats the processing step S100 and the processing step S102 until it is determined that the transporting instruction was received.

When the transporting instruction receiving unit 214 has determined that the transporting instruction was performed (Yes in S104), that is, when the transporting instruction receiving unit 214 has received the transporting instruction, the temperature difference calculating unit 216 calculates the temperature difference between the specimen holder 24 and the second transporting mechanism 90 based on the information on the temperature of the specimen holder 24 measured by the first temperature sensor 110, and the information on the temperature of the second transporting mechanism 90 measured by the second temperature sensor 112 (S106).

The transporting control unit 218 determines whether or not the temperature difference calculated by the temperature difference calculating unit 216 is the threshold or more (S108).

When the transporting control unit 218 has determined that the temperature difference is lower than the threshold (No in S108). The transporting control unit 218 causes the second transporting mechanism 90 to transport the cartridge 2 from the specimen exchange chamber 30 to the specimen chamber 20 (S110).

Figure 5:
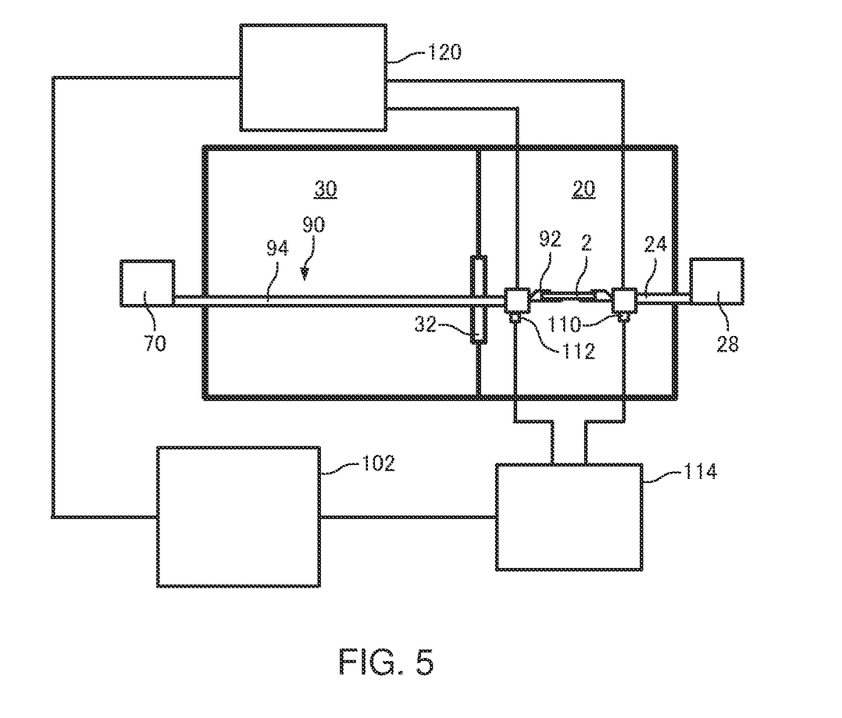
FIG. 5 is a diagram illustrating a state where a second transporting mechanism is transporting a cartridge from a specimen exchange chamber to a specimen chamber.
Figure 6:
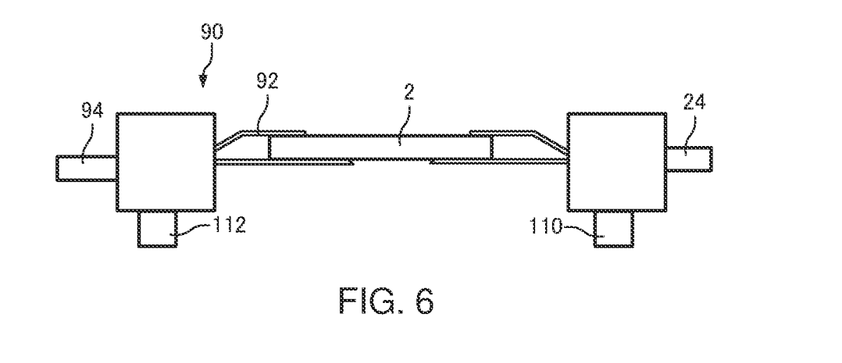
FIG. 6 is a diagram illustrating a state where a second transporting mechanism is transporting a cartridge from a specimen exchange chamber to a specimen chamber.
Figure 7:
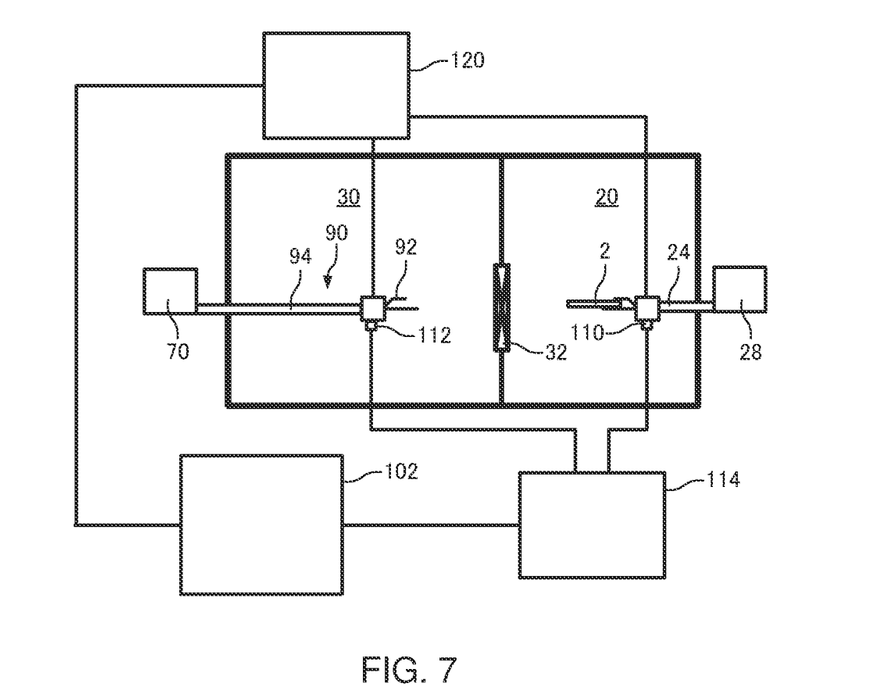
FIG. 7 is a diagram illustrating a state where a second transporting mechanism is transporting a cartridge from a specimen exchange chamber to a specimen chamber.

FIG. 5 to FIG. 7 are diagrams illustrating a state where the second transporting mechanism 90 is transporting the cartridge 2 from the specimen exchange chamber 30 to the specimen chamber 20.

The transporting control unit 218 sends a control signal to the control circuit 120 to transport the cartridge 2 to the specimen chamber 20.

When a control signal is sent to the control circuit 120 in a state where the second transporting mechanism 90 is holding the cartridge 2 in the specimen exchange chamber 30, as illustrated in FIG. 2, the gate valve 32 opens, as illustrated in FIG. 5, and the second transporting mechanism 90 moves the transporting rod 94 so as to transport the cartridge 2 to the specimen chamber 20. Then as illustrated in FIG. 6, the second transporting mechanism 90 transfers the cartridge 2 held by the chuck device 92 to the specimen holder 24 in the specimen chamber 20. After transferring the cartridge 2 to the specimen holder 24, the second transporting mechanism 90 retracts the chuck device 92 into the specimen exchange chamber 30, as illustrated in FIG. 7.

Then the gate valve 32 is closed, and the electron microscope 100 enters a state where a specimen can be observed.

When the transporting control unit 218 has determined that the temperature difference is the threshold or more (Yes in S108), the transporting control unit 218 stops transporting the cartridge 2 (S112). The transporting control unit 218 causes the second transporting mechanism 90 to maintain the state where the cartridge 2 is in the specimen exchange chamber 30, as illustrated in FIG. 2, for example.

Then the notification unit 219 notifies the alarm information (S114).

The control unit 102 ends the transporting processing after processing step S110 or the processing step S114.

In the above description, the second transporting mechanism 90 transports the cartridge 2 from the specimen exchange chamber 30 to the specimen chamber 20, but the control unit 102 also performs the same processing in a case where the second transporting mechanism 90 transports the cartridge 2 from the specimen chamber 20 to the specimen exchange chamber 30.

5. Functional Effect

In the electron microscope 100, when the control unit 102 has received an instruction to transport a specimen, the control unit 102 performs processing of: calculating the temperature difference between the specimen holder 24 and the second transporting mechanism 90; determining whether or not this temperature difference is a threshold or more; and stopping transportation of a specimen if it has been determined that this temperature difference is the threshold or more, based on information on the temperature of the specimen holder 24 measured by the first temperature sensor 110 and information on the temperature of the second transporting mechanism 90 measured by the second temperature sensor 112.

Therefore in the electron microscope 100, transportation of a specimen is stopped when there is a temperature difference, hence it can be prevented that the specimen holder 24 and the second transporting mechanism 90 rub against each other, or that the specimen holder 24 and the cartridge 2 rub against each other due to the positioning misalignment of the specimen holder 24 and the second transporting mechanism 90 when a specimen is transferred.

Figure 8:
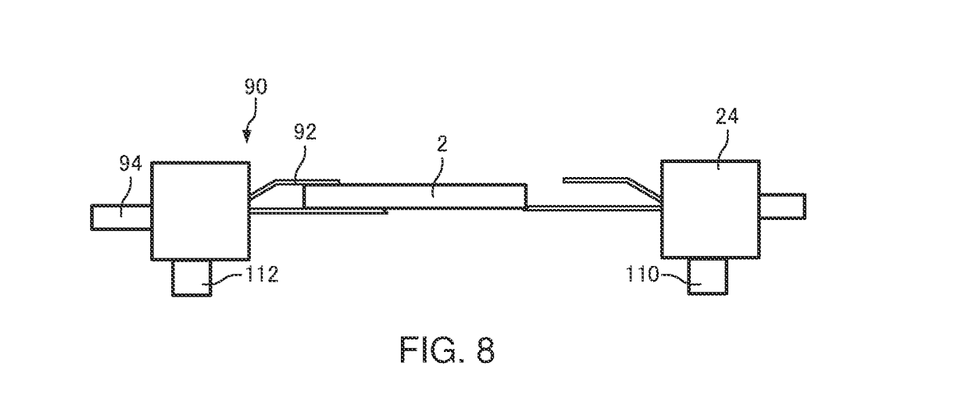
FIG. 8 is a diagram illustrating a state where positions of a specimen holder and a second transporting mechanism are misaligned when a cartridge is transferred.

FIG. 8 is a diagram illustrating a state where the positions of the specimen holder 24 and the second transporting mechanism 90 are misaligned when the cartridge 2 is transferred.

In the case of the example in FIG. 8, the height of the specimen holder 24 and the height of the second transporting mechanism 90 are not aligned. When such a misalignment occurs, the specimen holder 24 and the cartridge 2 may rub against each other, or the specimen holder 24 and the second transporting mechanism 90 may rub against each other, and metal particles and the like may scatter. If such metal particles adhere to a specimen, a specimen image cannot be observed accurately. Furthermore, if the specimen holder 24 and the cartridge 2 rub against each other, or if the specimen holder 24 and the second transporting mechanism 90 rub against each other, the specimen holder 24 and the second transporting mechanism 90 deteriorate. And in some cases a specimen may be damaged.

In the case of the example in FIG. 8, the height of the specimen holder 24 and the height of the second transporting mechanism 90 are not aligned, but a similar problem occurs when the horizontal positions of the specimen holder 24 and the second transporting mechanism 90 are not aligned.

In the electron microscope 100, transportation of a specimen is stopped when there is a temperature difference, therefore the above mentioned problem does not occur.

In the electron microscope 100, the control unit 102 performs processing of notifying the alarm information when the control unit 102 has determined that the temperature difference is the threshold or more. Therefore in the electron microscope 100, the user can recognize that the specimen holder 24 and the second transporting mechanism 90 have a temperature difference.

The electron microscope 100 includes the first cooling mechanism 28 that cools the specimen holder 24, and the second cooling mechanism 70 that cools the second transporting mechanism 90. Therefore in the electron microscope 100, a specimen at low temperature can be observed. Further, in the electron microscope 100, a temperature difference is generated between the specimen holder 24 and the second transporting mechanism 90 when the liquid nitrogen in the first cooling mechanism 28 or in the second cooling mechanism 70 vaporizes and no longer exists. However, in the electron microscope 100, transportation of a specimen is stopped when there is a temperature difference, as mentioned above, hence it can be prevented that the specimen holder 24 and the second transporting mechanism 90 rub against each other, or that the specimen holder 24 and the cartridge 2 rub against each other, even in the case where the liquid nitrogen in the first cooling mechanism 28 or the second cooling mechanism 70 vaporizes and no longer exists.

6. Modification

The invention is not limited to the above mentioned embodiment, but various modifications are possible within the scope of the spirit of the invention.

6.1. Modification 1

In the above embodiment, the case where the electron microscope 100 is a cryo-electron microscope was described, but the changed particle beam apparatus according to the invention is not limited to the cryo-electron microscope, but may be a transmission electron microscope for observing a specimen at room temperature.

Figure 9:
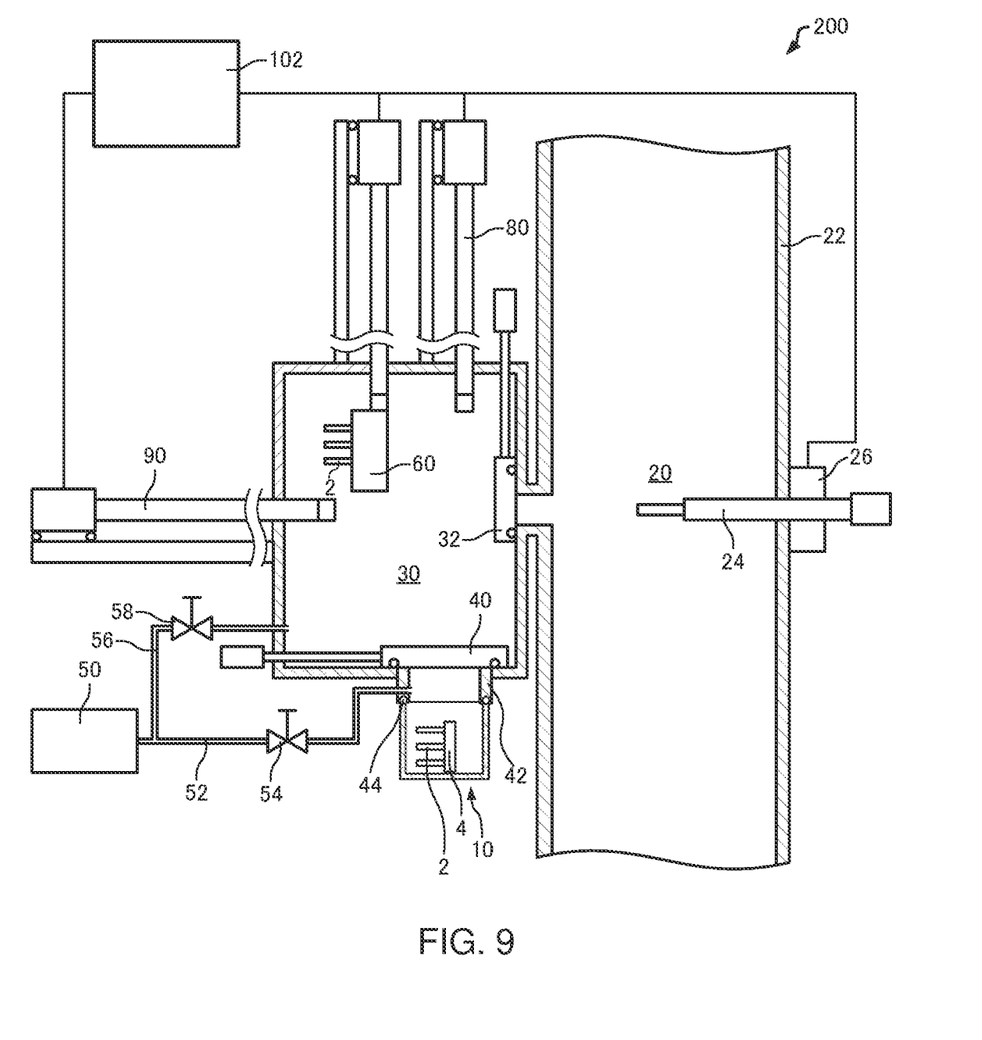
FIG. 9 is a diagram illustrating an electron microscope according to a modification.

FIG. 9 is a diagram illustrating a configuration of an electron microscope 200 according to a modification.

As illustrated in FIG. 9, the electron microscope 200 does not include the first cooling mechanism 28 to cool the specimen holder 24, and the second cooling mechanism 70 to cool the first transporting mechanism 80 and the second transporting mechanism 90.

Here bakeout is performed in the electron microscope 200 in order to maintain the inside of the lens barrel 22 in the high vacuum state. "Bakeout" refers to an operation to forcibly discharge gas occluded in the inner wall of the lens barrel 22 by heating the inner wall of the lens barrel 22 in the vacuum state using a baking device (not illustrated). After performing bakeout, the amount of gas to be discharged later can be reduced.

When bakeout of the lens barrel 22 is performed in the electron microscope 200 like this, a temperature difference is generated between the specimen holder 24 and the second transporting mechanism 90. In the electron microscope 200, just like the electron microscope 100, transportation of a specimen is stopped when there is a temperature difference. Therefore a similar functional effect as in the electron microscope 100 can be implemented in the electron microscope 200.

6.2. Modification 2

In the embodiment described above, the charged particle beam apparatus according to the invention is the transmission electron microscope, but the charged particle beam apparatus according to the invention is not limited to the transmission electron microscope. The charged particle beam apparatus according to the invention may be a scanning transmission electron microscope (STEM), a scanning electron microscope (SEM), an electron probe microanalyser (EPMA), a focused ion beam apparatus (FIB), an electron beam exposure apparatus, or the like.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam apparatus comprising:
a specimen chamber;
a specimen holder that is disposed in the specimen chamber;
a specimen exchange chamber that is connected to the specimen chamber;
a transporting mechanism that transports a specimen between the specimen chamber and the specimen exchange chamber;
a first temperature sensor that measures a temperature of the specimen holder;
a second temperature sensor that measures a temperature of the transporting mechanism; and
a control unit configured to control the transporting mechanism,
the control unit performing processing of:
calculating a temperature difference between the specimen holder and the transporting mechanism based on information on the temperature of the specimen holder measured by the first temperature sensor and information on the temperature of the transporting mechanism measured by the second temperature sensor when the control unit has received an instruction to transport a specimen;
determining whether the temperature difference is a threshold or more; and
stopping transportation of a specimen when the control unit has determined that the temperature difference is the threshold or more.

2. The charged particle beam apparatus according to claim 1, wherein
the control unit performs processing of notifying alarm information when the control unit has determined that the temperature difference is the threshold or more.

3. The charged particle beam apparatus according to claim 1, further comprising:
a first cooling mechanism that cools the specimen holder; and
a second cooling mechanism that cools the transporting mechanism.

4. The charged particle beam apparatus according to claim 1, wherein
the control unit causes the transporting mechanism to transport a specimen when the control unit has determined that the temperature difference is lower than the threshold.

5. The charged particle beam apparatus according to claim 1, wherein
the transporting mechanism comprises:
a chuck device that holds a specimen; and
a transporting rod that supports the chuck device, and
the second temperature sensor measures a temperature of the chuck device or a temperature of the transporting rod.

\* \* \* \* \*